(12) United States Patent
Hwan

(10) Patent No.: US 6,940,183 B1
(45) Date of Patent: Sep. 6, 2005

(54) COMPOUND FILLED IN LEAD IC PACKAGING PRODUCT

(76) Inventor: Lu-Chen Hwan, 10F-2, No. 229, Chinlung Rd., Neihu Dist., Taipei (TW)

( * ) Notice: Subject to any disclaimer, the term of this patent is extended or adjusted under 35 U.S.C. 154(b) by 0 days.

(21) Appl. No.: 10/860,056

(22) Filed: Jun. 4, 2004

(51) Int. Cl.⁷ .............................................. H01L 23/28
(52) U.S. Cl. ...................... 257/787; 257/666; 257/738; 257/778; 257/780; 257/784; 257/788
(58) Field of Search ............................... 257/666, 787, 257/788, 778, 738, 780, 784

(56) References Cited

U.S. PATENT DOCUMENTS 5,324,981 A * 6/1994 Kobiki et al. ............... 257/276
5,969,426 A * 10/1999 Baba et al. .................. 257/778
6,262,489 B1 * 7/2001 Koors et al. ................ 257/784
6,548,328 B1 * 4/2003 Sakamoto et al. .......... 438/121
6,700,194 B2 * 3/2004 Nakajima et al. ........... 257/707

* cited by examiner

*Primary Examiner*—Gene M. Munson
(74) *Attorney, Agent, or Firm*—Troxell Law Office, PLLC

(57) ABSTRACT

A compound filled in lead packaging integrated circuit product includes a substrate made of a metallic material, a metallic protection layer formed on a top face of the substrate for protection of the substrate and surface mounting of an electrical appliance, the electrical appliance securely mounted on the protection layer and a compound or encapsulation material surrounding the substrate and the electrical appliance for supporting the substrate.

8 Claims, 4 Drawing Sheets

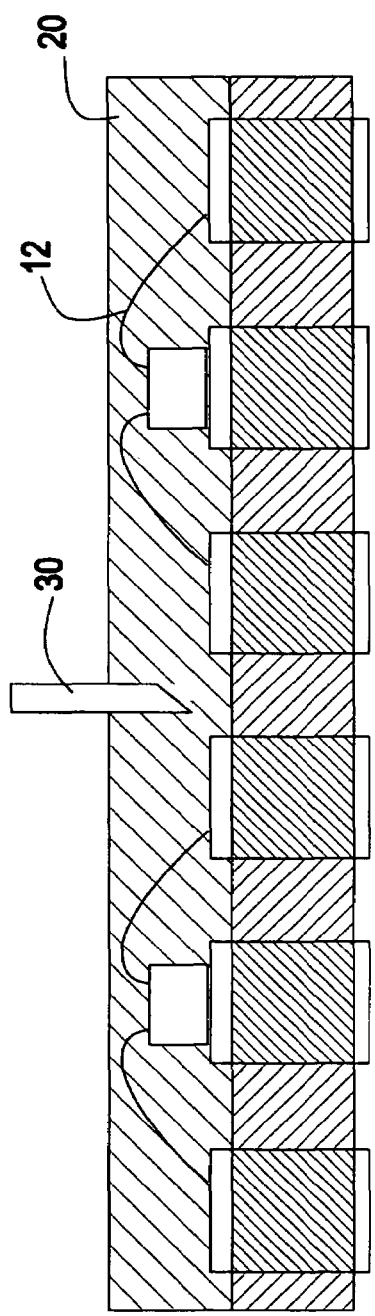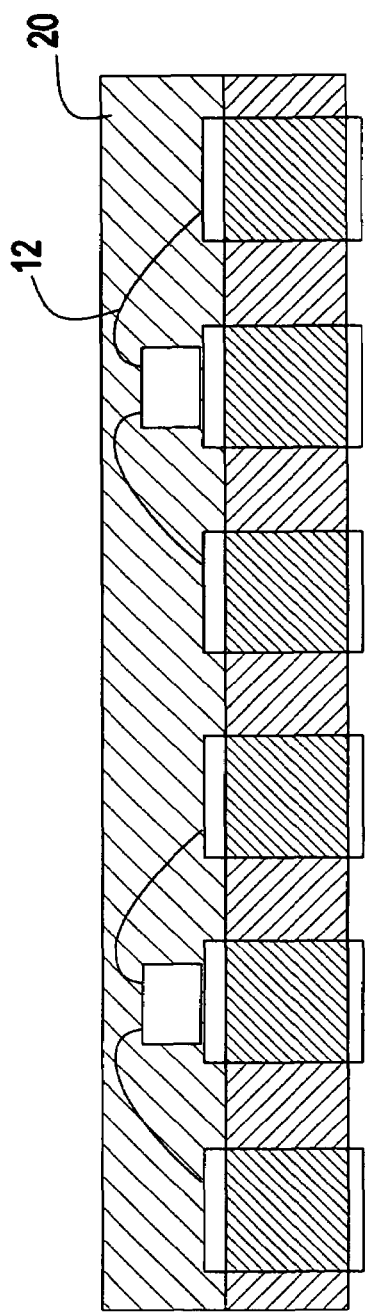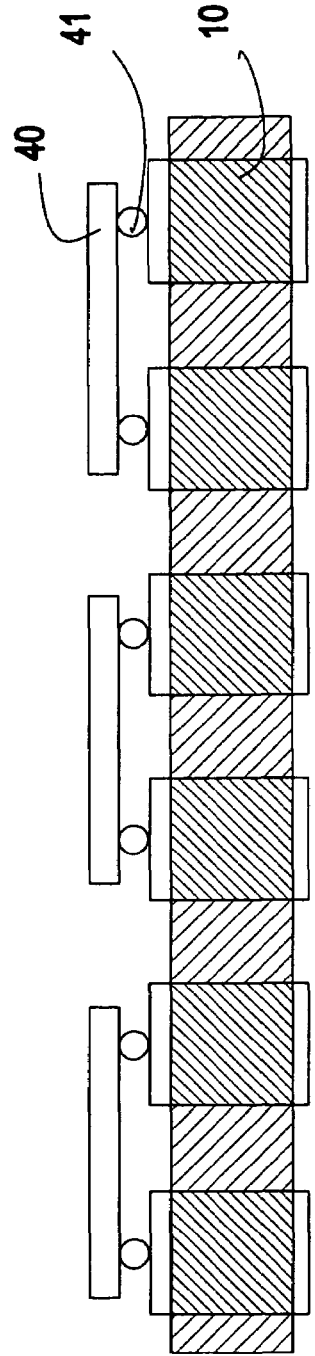

COMPOUND FILLED IN LEAD IC PACKAGING PRODUCT

BACKGROUND OF THE INVENTION

1. Field of the Invention

The present invention relates to a compound filled in lead integrated circuit package product, and more particularly to a substrate made of metal and filled in with compound or encapsulation material to support the lead of the packaged IC product.

2. Description of Related Art

In a conventional encapsulated integrated circuit (IC) product, the lead frame (70) is hollow and the lead (71) on top of the lead frame (70) is a continuous wire, as shown in FIG. 1. The lead (71) has to be continuous so as to support each other in the manufacture process. The lead frame (70) has to undergo a trimming process and a forming process to cut off and bend the lead (71) to avoid interference between each semi-product. The two processes prolong the entire manufacture process and thus the manufacture efficiency is low. Although the QFN (Quad Flat Non-Leaded) product amount has increased in popularity in recent years, the same problem bothers the QFN production line.

The application in encapsulated IC products of continuous lead or lead frame still suffers from the following problems:

When the QFN is encapsulated, an adhesive tape is applied to the bottom of the lead frame to prevent overflow of the molding compound or encapsulation material. However, the molding compound or encapsulation material may flow to the bottom of the lead frame and the contacts on the bottom of the lead frame are contaminated. A different method is to use a stop attached to the bottom of the lead frame to prevent the encapsulation material from overflow. After the encapsulation process is finished, the stop is then removed. Although either method effectively stops encapsulation material overflow, however, manufacture cost is increased and product quality is decreased.

Furthermore, during the trimming process, due to the continuity of the lead, the blade is constantly engaged in the cutting process and so is worn out quickly, whereby the manufacture cost is high.

Tests for conductivity of the IC product have to wait until after the completion of the trimming process and thus the overall manufacture processing time is prolonged.

To overcome the shortcomings, the present invention tends to provide an improved encapsulated IC product to mitigate the aforementioned problems.

SUMMARY OF THE INVENTION

The primary objective of the present invention is to provide an improved encapsulated IC product with a molding compound or encapsulation material to support the lead before the combination of the substrate and the electrical appliance such that the manufacture time is low.

Another objective of the present invention is to provide a solid substrate so that encapsulation material overflow is eliminated.

Other objects, advantages and novel features of the invention will become more apparent from the following detailed description when taken in conjunction with the accompanying drawings.

BRIEF DESCRIPTION OF THE DRAWINGS

FIG. 5 is a schematic cross sectional view showing that the substrate is being trimmed after completion of wire bond and encapsulation;

FIG. 6 is a schematic cross sectional view showing the structure of the substrate after the trimming process;

FIG. 7 is a schematic view showing the product of implementation of flip-chip product;

DETAILED DESCRIPTION OF THE PREFERRED EMBODIMENT

Figure 1:
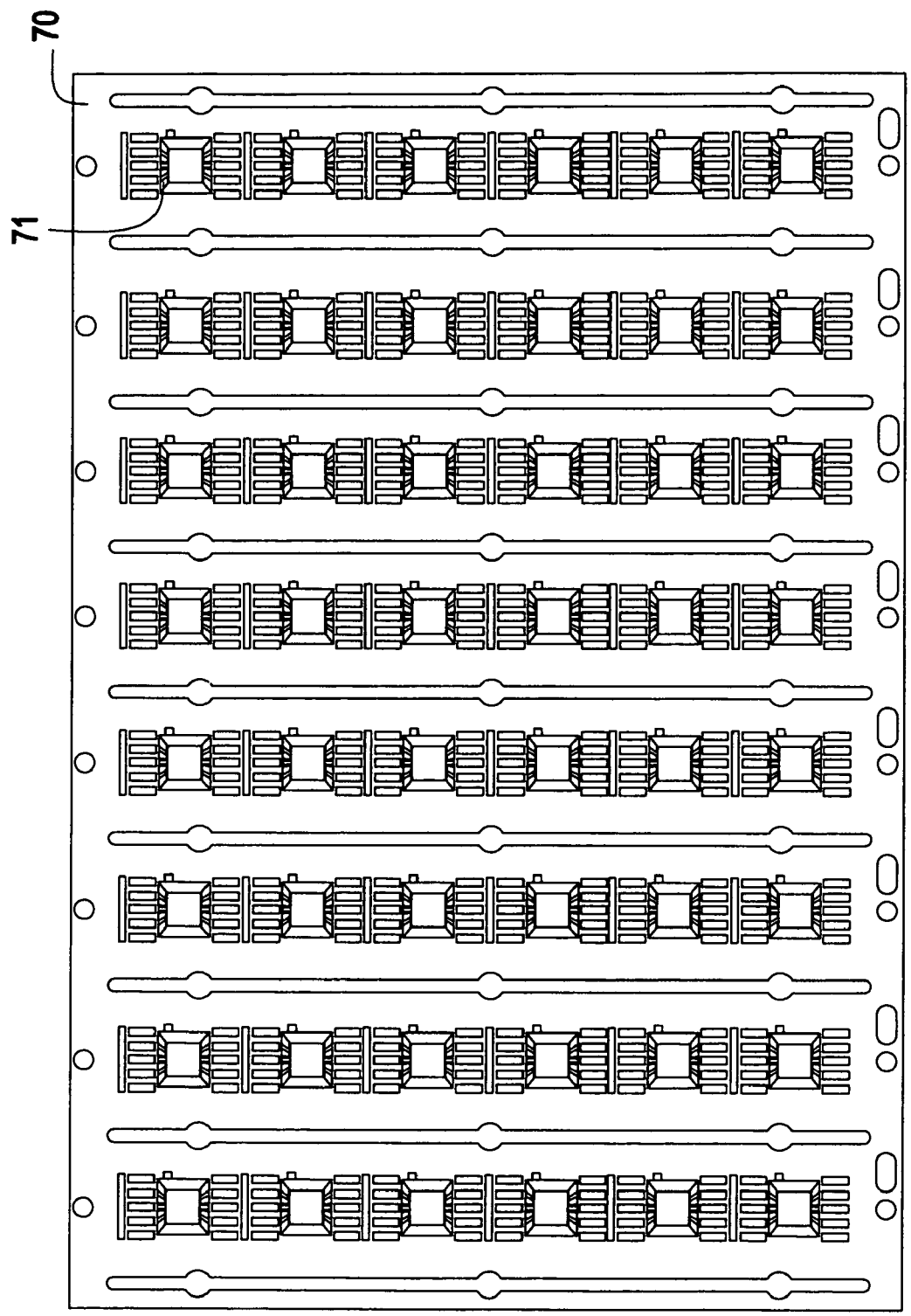
FIG. 1 is a top plan view showing a conventional lead frame.
Figure 2:
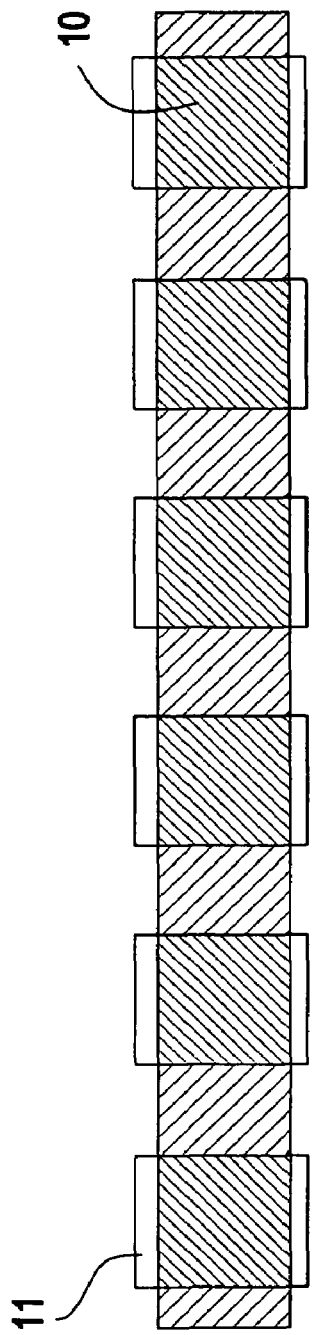
FIG. 2 is a schematic cross sectional view of the substrate of the present invention.
Figure 3:
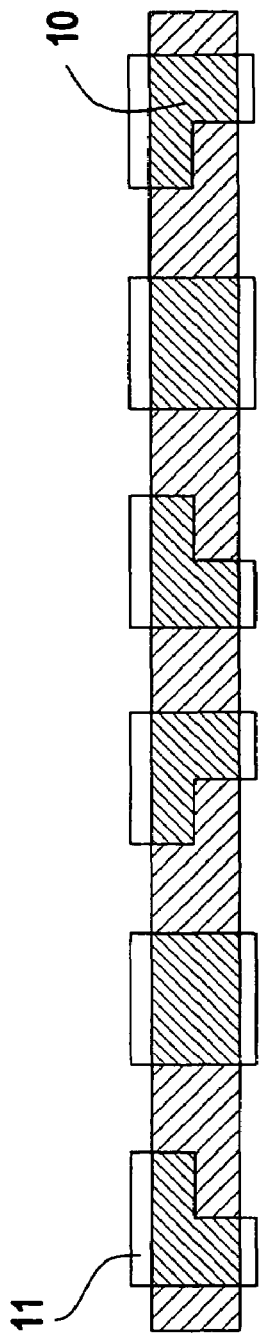
FIG. 3 is a schematic cross sectional view showing that the substrate is etched for the preparation to support the lead.
Figure 4:
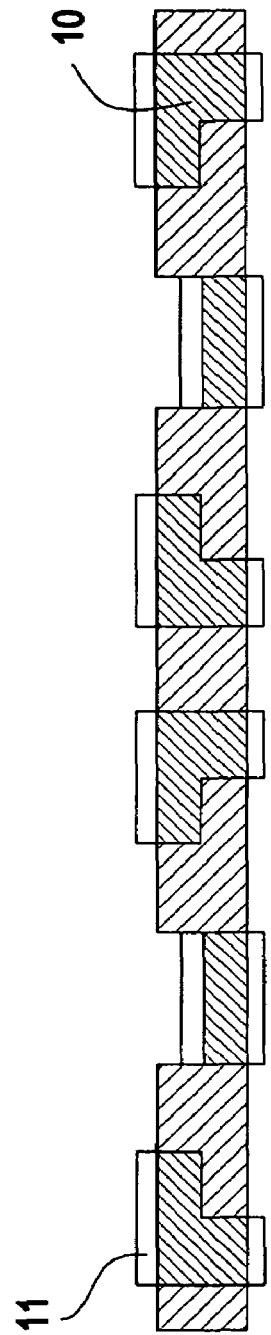
FIG. 4 is a schematic cross sectional view showing a different embodiment of the substrate of the present invention.

With reference to FIGS. 2–4, the compound filled in lead packaging IC product of the present invention includes a solid substrate (10) with a surrounding compound or encapsulation material in support of the substrate (10). A metallic protection layer (11), i.e. gold, nickel, silver, cobalt or a combination thereof, is plated onto the surfaces of the substrate (10) to allow electrical communication between a top face and a bottom face of the substrate (10) and to protect the wire (12) or to provide an adhesive function for electrical appliance attachment. The substrate (10) made of metal may be of any desired shape to adapt to electricity and thermal characteristics of the designed product. A plating process and an etching process may be involved in the preparation of the substrate (10). The encapsulation material (20) functions are to ① support the substrate; ② function as a dielectric material; ③ function as a heat conductor; ④ function as a stop to prevent encapsulation material from overflow; ⑤ function as a pathway for a trimming process; and ⑥ function as a solder mask in the surface mount technology (SMT). The compound or encapsulation material (20) may be epoxy or polyimide or any other macromolecular polymer and is able to be formed by coating or printing.

The compound filled in lead packaging IC product may be applied to different encapsulated technology such as wire-bonding, flip chip, or gold to gold ultrasonic bonding technology. Because wire bonding is to fix the wire onto the hard substrate (10), the strength and bonding relationship therebetween is strong, which is shown in FIG. 5. Taking the QFN product for example, during the encapsulation process, the bottom of the substrate has to be sealed to prevent encapsulation overflow. However, after the encapsulation process, the bottom of the substrate has to be cleaned to prevent contamination to the contacts of the substrate. Conventionally, two methods are adopted to accomplish the desired goals; one is to apply an adhesive tape to the substrate bottom and the other is to apply a layer of Au or Ni or metal plate or the combination thereof. After the encapsulation process, the adhesive tape or the metal plate attached to the substrate bottom is removed. In the process of the present invention, the encapsulation material (20)

plays the same role to remove the necessity of attachment of adhesive tape or any metal to the bottom of the substrate. Therefore, during the trimming process, because there is no wire between two encapsulated IC products and the wires are supported by the encapsulation material (20), the blade (30) to perform the trimming process on the encapsulated IC product will not be excessively worn so that the manufacture cost is low.

Figure 8:
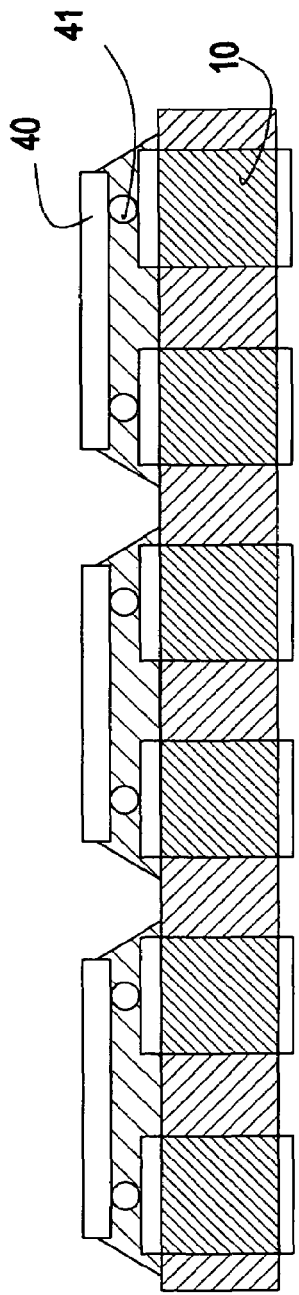
FIG. 8 is a schematic view showing the structure in FIG. 7 with the encapsulation material filled to the bottom of the substrate.

With reference to FIGS. 7 and 8, it is noted that a chip (40) is mounted onto the substrate (10), which is called flip chip. Solder balls (41) are mounted under the chip (40) to provide electrical communication between the chip (40) and the metallic protection layer (11).

Figure 9:
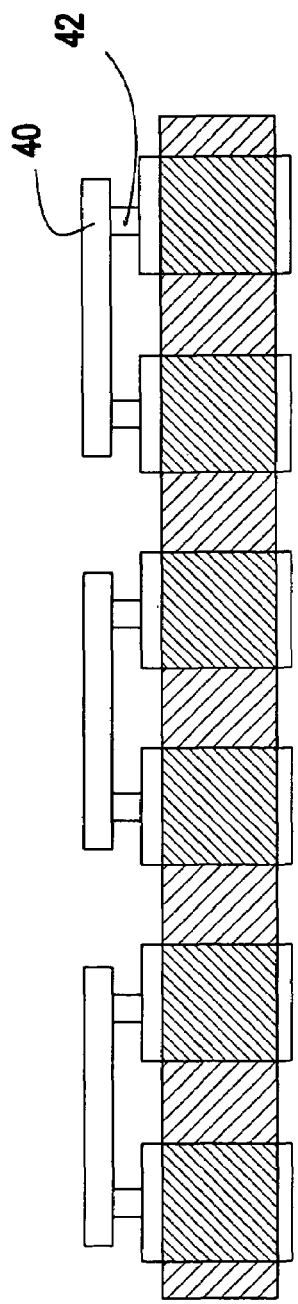
FIGS. 9 and 10 are schematic views showing a different flip-chip product.
Figure 10:
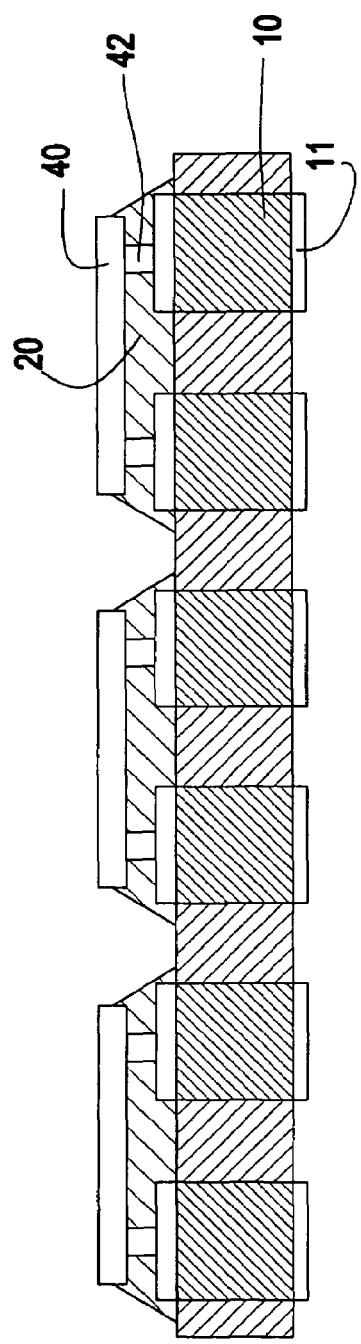

With reference to FIGS. 9 and 10, solder balls (41) formed under the chip (40) as shown in FIG. 7 are changed to gold or similar metallic bosses (42). The bonding between the substrate (10) and the chip (40) may be hot pressing, ultrasonic or non-conductive polymer. The bonding relationship between the substrate (10) and the bosses (42) may be accomplished by Au—Au or silver via hot pressing or via conductive encapsulation. After the combination between the substrate (10) and the chip (40), an underfill is filled into a gap between the substrate (10) and the chip (40).

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A compound filled in lead packaging integrated circuit product comprising:
    a substrate made of a metallic material and polymer compound filled in lead;
    a metallic protection layer formed on a top face of the substrate for protection of the substrate and surface mounting of electrical appliance;
    an electrical appliance securely mounted on the protection layer; and
    an encapsulation material surrounding the substrate and the electrical appliance for supporting the substrate.

2. The product as claimed in claim 1, wherein the metallic protection layer is an alloy of gold, silver or nickel or silver, nickel and cobalt.

3. The product as claimed in claim 2, wherein the encapsulation material is a dielectric material and is selected from the group consisting of epoxy, polyimide or macromolecular polymer.

4. The product as claimed in claim 3, wherein the electrical appliance is a chip.

5. The product as claimed in claim 4, wherein the chip is electrically connected to the substrate via solder balls.

6. The product as claimed in claim 4, wherein the chip is electrically connected to the substrate via bosses.

7. The product as claimed in claim 6, wherein the bosses are made of a material consisting of gold, brass, nickel or the combination thereof.

8. The product as claimed in claim 1, wherein a bonding relationship between the electrical appliance and the substrate is accomplished by hot pressing or ultrasonic welding.

* * * * *